United States Patent [19]
Nagode et al.

[11] Patent Number: 6,043,721
[45] Date of Patent: Mar. 28, 2000

[54] DUAL BAND AMPLIFIER

[75] Inventors: Thomas Dominic Nagode, Chicago; Rashid Masood Osmani; Aamir Ali Abbasi, both of Mundelein, all of Ill.

[73] Assignee: Motorola, Inc., Schaumburg, Ill.

[21] Appl. No.: 09/018,671

[22] Filed: Feb. 4, 1998

[51] Int. Cl.$^7$ .............................. H03F 3/189; H03F 3/191
[52] U.S. Cl. .......................... 332/117; 330/150; 330/151; 330/51; 455/266; 455/341; 455/188.1; 455/200.1; 455/127
[58] Field of Search ...................................... 455/126, 266, 455/341, 253.2, 251.1, 188.1, 200.1, 127; 330/150, 151, 51; 332/117

[56] References Cited

U.S. PATENT DOCUMENTS

| | | |
|---|---|---|
| 5,060,294 | 10/1991 | Schwent et al. . |
| 5,437,051 | 7/1995 | Oto ........................................... 455/3.2 |
| 5,499,394 | 3/1996 | Kaatz et al. ............................. 455/266 |
| 5,661,434 | 8/1997 | Brozovich et al. ........................ 330/51 |

FOREIGN PATENT DOCUMENTS 2117588  3/1983  United Kingdom .

*Primary Examiner*—Arnold Kinkead
*Attorney, Agent, or Firm*—Michael C. Soldner; Randall S. Vaas

[57] ABSTRACT

An amplifier (104) for a dual band device includes multiple amplifier stages coupled between an input (103) and output (105). The amplifier stages include a first amplifier stage (200) having a first amplifier (206), a second amplifier stage (202) having a second amplifier, and a third amplifier stage (204) having a third amplifier (210). A first bypass (218) in said first amplifier stage provides a bypass for signals in a first frequency band. A second bypass (250) is provided in the third amplifier stage, the second bypass to provide for signals in a second frequency band a signal path that bypasses the third amplifier. Signals in the first and second frequency bands are amplified by the second amplifier.

18 Claims, 5 Drawing Sheets

DUAL BAND AMPLIFIER

FIELD OF THE INVENTION

The present invention pertains to amplifiers for dual band devices.

BACKGROUND OF THE INVENTION

A variety of devices are known that include radio frequency (RF) transmitters, or transceivers, for communicating with other compatible devices. Examples of such devices include radiotelephones (which may be cordless or cellular telephones), two-way radios, modems, smart phones, personal digital assistants (PDA), or the like. Those devices that operate in two modes are called dual mode devices. Dual mode devices transmit signals according to two different formats, such as digital time division multiple access (TDMA) and analog signaling formats. Other devices operate in two frequency bands, and are referred to as dual band. For example, digital TDMA devices operate at 900 MHz and 1800 MHz.

It is known to provide separate amplifiers for dual mode devices. In such circuits, switches are used to select one amplifier for one mode and another independent amplifier for the other mode. Although this arrangement provides for optimum performance in each mode, it requires two independent amplifiers, which is costly. Additionally, the switches used to select the amplifier for a particular mode add harmonic noise to the system.

Dual mode devices are also known which incorporate a single, multi-stage amplifier having interstage switchable matching networks for accommodating both modes of operation. However, these systems are inefficient when applied to dual band devices.

Accordingly, there is a need for a more efficient, and improved, amplifier system for dual band devices.

DETAILED DESCRIPTION OF THE DRAWINGS

Figure 1:
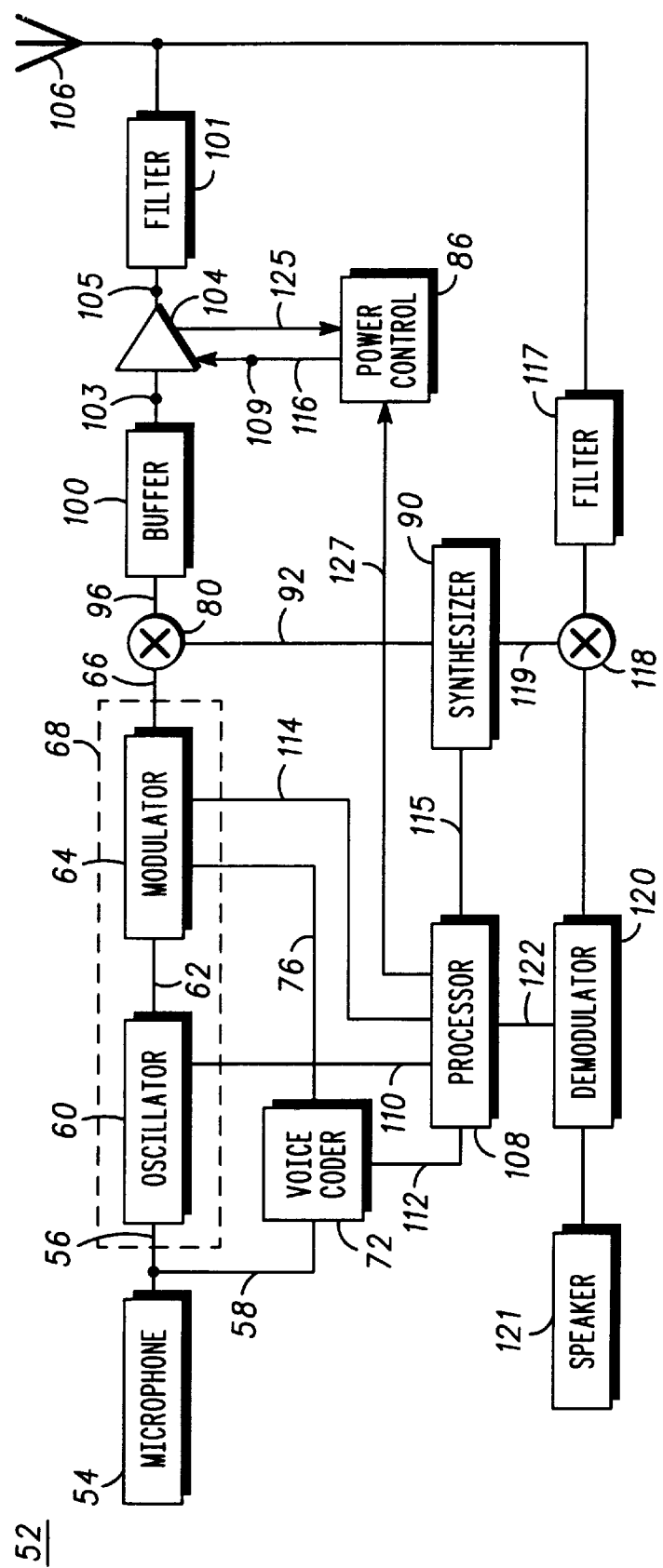
FIG. 1 is a circuit schematic in block diagram form illustrating a radiotelephone including a multiple band amplifier.

FIG. 1 Illustrates in block diagram form, a radiotelephone 52. The radiotelephone radio transceiver, connected between a microphone 54 and an antenna 106, incorporates a dual band amplifier 104. The actual circuitry embodying the functional blocks of the diagram in FIG. 1 may be disposed upon one or more circuit boards and housed within a conventional radiotelephone housing, such as a cellular telephone housing. The transmitter in the transceiver of radiotelephone 52 may require only one amplifier by providing means to operate the amplifier in both bands. Efficient amplification of a signals modulated in different distinct bands is thereby possible, while, at the same time, minimizing circuit size and cost.

With reference to FIG. 1, microphone 54 converts voice signals supplied thereto into an electrical, information signal, and generates an output indicative thereof on lines 56 and 58.

The information signal supplied on line 56 is utilized when a frequency modulated information signal is to be generated by radiotelephone 52. The information signal supplied on line 58 is utilized when a discrete, encoded signal modulated to form a composite modulated information signal is to be generated by radiotelephone 52. A communication device employing the dual band amplifier may generate one or both of these signal formats.

The information signal generated on line 56 is supplied to voltage controlled oscillator (VCO) 60 whereat the information signal is combined with an oscillating signal of a certain frequency. A frequency modulated information signal is generated by voltage controlled oscillator 60 on line 62 to modulator 64. When radiotelephone 52 is to transmit a frequency modulated information signal, modulator 64 does not alter the frequency modulated information signal supplied thereto on line 62, but, rather, "passes-through" the frequency modulated information signal on line 66. Oscillator 60 and modulator 64 may together comprise a hybrid modulation apparatus, referred to by block 68.

The information signal generated on line 58 is supplied to a voice coder, or vocoder, 72 whereat the analog information signal is digitized and encoded according to an encoding scheme, such as the encoding scheme specified for GSM or DCS. A discrete, encoded signal is generated and output on line 76 such that it is supplied to modulator 64. Modulator 64 modulates the discrete, encoded signal supplied thereto on line 76 to form a composite modulated information signal of a pre-determined frequency on line 66.

Although a device is described above which generates both a signal format using voice coder 72 and a signal format passing through oscillator 60, those skilled in the art will recognize that a dual band device can be used with a device supporting only one signal format. Alternatively, the device may communicate using other signal formats.

The modulated information signal supplied on line 66, either modulated according to a frequency modulation technique or a composite modulation technique, is supplied to mixer, or modulator, 80. Mixer 80 mixes the signal supplied thereto on line 66 with an offset transmission-frequency carrier wave generated by synthesizer 90 and supplied to mixer 80 on line 92. Mixer 80 mixes the modulated information signal supplied thereto on line 66 with the carrier wave supplied thereto on line 92. Mixer 80 generates a modulated information signal upon a carrier wave of a carrier frequency determined by the oscillating frequency of synthesizer 90 and oscillator 60 on line 96. Thus the carrier signal determines the frequency band of the signal transmitted via antenna 106.

Line 96 is coupled to buffer 100 which forms a passband for signals in the frequency bands at which the radiotelephone operates. Buffer 100 generates a filtered signal, containing the modulated information signal, at input 103 of amplifier 104. Amplifier 104 is a power amplifier to amplify the modulated information signal supplied thereto to power levels adequate for transmission through antenna 106 under the control of power control signals input at control input 109. The output signal is monitored to provide a feedback signal on conductor 125. Prior to transmission of the amplified signal, and as illustrated, the amplified signal may be filtered by filter 101 which may, for example, form a portion of a diplexer. Filter 101 is positioned in-line between amplifier 104 and antenna 106.

The gain is controlled by power control 86 responsive to control signals on bus 127 from processor 108. The processor 108 generates power control signals to control the amplifier 104 to output signals at levels specified by regulatory bodies. Power control 86 thus receives a feedback signal from amplifier 104 on conductor 125 which is used by the power control circuit in setting the gain of the transmitter using amplifier 104 responsive to power level signals on bus 127.

Processor 108 provides output signals on lines 110, 112, 114, and 115 to control operation of oscillator 60, vocoder 72, modulator 64, and synthesizer 90, respectively, to control modulation of the information signal generated by microphone 54. Processor 108 controls the frequency band of the device, exemplified by radiotelephone 52.

Processor 108 controls whether the information signal generated by microphone 54 is modulated by oscillator 60 to form a frequency modulated information signal, or alternatively, is encoded by vocoder 72 according to a discrete encoding scheme and modulated by modulator 64 to form a composite modulated information signal.

FIG. 1 further illustrates the radiotelephone 52 receive circuit for supplying a signal detected by antenna 106 to speaker 121. The signal detected by antenna 106 is supplied to filter 117 which passes signals of desired frequencies to mixer 118. Mixer 118 receives an oscillating signal from synthesizer 90 on line 119, and generates a mixed signal which is supplied to demodulator 120. Demodulator 120 supplies a demodulated, electrical information signal to speaker 121. Processor 108 may, and as illustrated, supply a signal to demodulator 120 on line 122 to control operation thereof. Speaker 121 converts the electrical information signal supplied thereto into audible signals.

The amplifier 104, although illustrated above in a radiotelephone 52, is for use in any dual band devices. The invention is particularly useful for portable radiotelephones, such as those operating according to two specifications, such as the Global Systems for Mobile Communications (GSM) specification and Digital Cellular System (DCS) specification. GSM devices operate in the frequency band from 880 MHz to 915 MHz. DCS operates in the frequency band from 1710 MHz to 1785 MHz. An economical amplifier operates efficiently using two stages for each frequency band, one stage being shared and the other stage being independent to each band. The amplifier thus employees two amplifier stages with interstage matching and negative bias level shift for each frequency band, one of the stages being shared for use in both bands.

More particularly, the input signals to amplifier 104 at input 103 are at a power level of 0 dBm to +10 dBm, where dBm is decibels with reference to one milliwatt. Amplifier 104 controls the power level at the output 105 to be in the range from −47 dBm to +34 dBm under normal biasing conditions. Normal biasing for the stages is from 0 volts to 2.5 volts, although the bias may be different for each stage and a bias voltage of −10 volts may be employed. The power added efficiency at nominal output is 50 percent.

Figure 2:
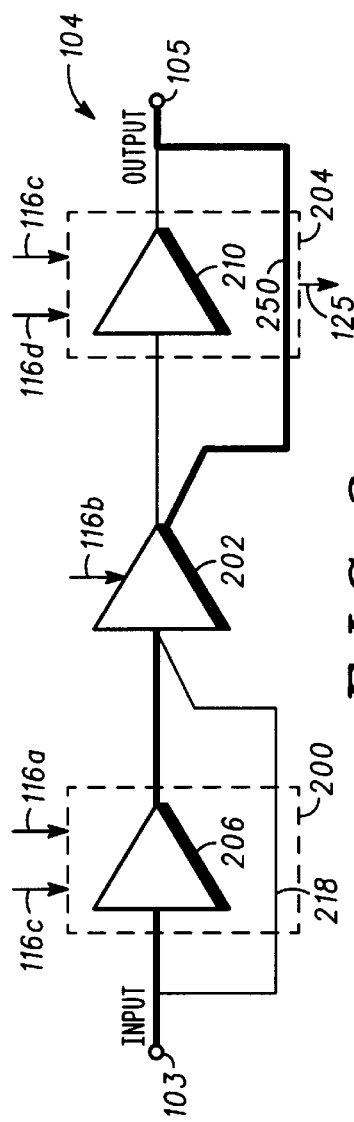
FIG. 2 is a schematic illustrating the multiple band amplifier.

Amplifier 104 includes a first amplifier stage 200 (FIG. 2), a second amplifier stage 202, and a third amplifier stage 204. The first, or input, amplifier stage 200 has two switchable paths. The lower frequency band signals pass through bypass 218 to the second amplifier stage 202, whereas signals in the higher frequency band are amplified in exciter amplifier 206. Exciter amplifier 206 provides amplification prior to further amplification in second amplifier stage 202.

The second amplifier stage 202 amplifies signals in both frequency bands. Amplifier 206 and the amplifier in amplifier stage 202 are optimized for signals in the higher frequency band.

Signals output from the second amplifier stage 202 are input to third amplifier stage 204. The third amplifier stage 204 includes an amplifier 210 to amplify signals in the lower frequency band. Signals in the higher frequency band bypass amplifier 210 through bypass 250. Bypass 250 and amplifier 210 are isolated as described hereinbelow.

Figure 3:
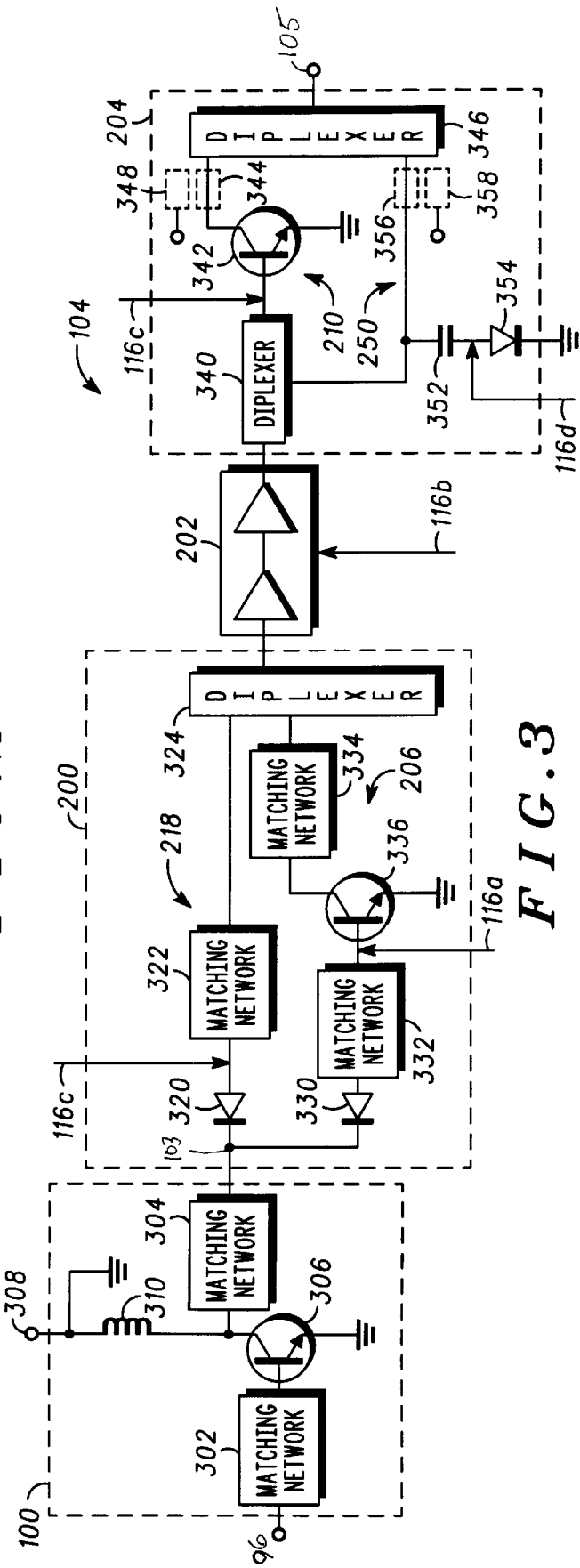
FIG. 3 is a circuit schematic in block diagram form illustrating the multiple band amplifier according to FIG. 2 in greater detail with the addition of a buffer stage.

Gain control signals are provided to amplifier 104 on conductors 116a, 116b, 116c and 116d (FIG. 3). As described hereinbelow, the gain control signals, or bias control signals, on these conductors control the gain of amplifier 104 and the signal path through amplifier 104. A feedback signal is output on conductor 125 from output amplifier stage 204 as will be described in greater detail hereinbelow.

Although three amplifier stages are illustrated, the invention may be used in an amplifier having different numbers of amplifier stages. Three amplifier stages are use to illustrate the invention.

With reference now to FIG. 3, a buffer 100 is connected to buffer signals prior to amplification. The buffer includes matching networks 302 and 304, which are provided to optimize performance in both frequency bands. A transistor 306, powered from supply 308 via inductor 310, provides isolation. The buffer 100 is not necessarily part of amplifier 104, but rather is provided to isolate mixer 80 from amplifier 104.

The first amplifier stage 200 includes a bypass 218. Bypass 218 includes a diode switch 320 and a matching network 322. Diode switch 320 is forward biased when the first frequency band is selected. This diode is reverse biased when the second frequency band is selected. The bypass 218 provides the signal path for signals in the lower frequency band. The first amplifier stage 200 also includes a diode switch 330, matching network 334, a transistor amplifier 336, and a matching network 334. The diode and transistor are turned "ON" when the second frequency band is selected and turned "OFF" (the diode is reverse biased and the transistor biased "OFF") when the first frequency band is selected. The first frequency band is a lower frequency band then the second frequency band in this example.

A diplexer 324 is connected to receive the signals output from matching networks 322 and 334. The diplexer 324 provides isolation between the signal paths through the first amplifier stage to prevent feedback across the amplifier 336. Transistor amplifier 336 is optimized for signals in the higher frequency band, such as the DCS signals in the radiotelephone example. The diplexer 324 has two inputs and one output. One of the inputs allows the lower frequency band to pass through but rejects the higher frequency band. The input passes the higher frequency and rejects the lower frequency band.

The second, or intermediate, amplifier stage 202 may for example be any commercially available integrated circuit amplifier. The amplifier is preferably optimized for the higher frequency band as it provides the principle amplification for signals in the higher frequency band. However, the second amplifier stage amplifier, or amplifiers, is tuned to operate in both the upper and lower frequency bands. Thus, a commercially available amplifier for DCS communications can be used in the illustrative example of a GSM/DCS dual band radiotelephone, although the amplifiers' inputs and outputs are tuned to operate in both bands.

The third, or output, amplifier stage 204 includes a diplexer 340 connected to receive the output signal from the second amplifier stage 202. The diplexer is connected to transistor amplifier 342. Amplifier 342 is connected to a diplexer 346 through a sensor element 344. The diplexer 340 is also connected to diplexer 346 through a bypass 250. Bypass 250 includes a capacitor 352 connected to ground through a diode switch 354. The gain control sensing element 356 is connected to diplexer 346. The diplexers 340 and 346 isolate the respective paths through the third amplifier stage 204. The diplexers 340 and 346 are designed to have high isolation such that feedback of the signals coming from the output of amplifier 342 are prevented from bleeding into its input. This is necessary to prevent amplifier 342 from oscillating. This is very important for the practical implementation of this dual band amplifier.

Sensor elements 344 and 356 are each electromagnetically coupled to a sensor element, 348 and 358, respectively. The signal level in the third amplifier stage of amplifier 104 is sensed by the signal electromagnetically coupled from sensor elements 344 and 356 to sensor elements 348 and 358, respectively.

The amplifier stages in amplifier 104 are optimized for a particular band. As used herein, "optimized" means that the maximum efficiency and gain of the amplifier is for signals in a particular frequency band.

Figure 4:
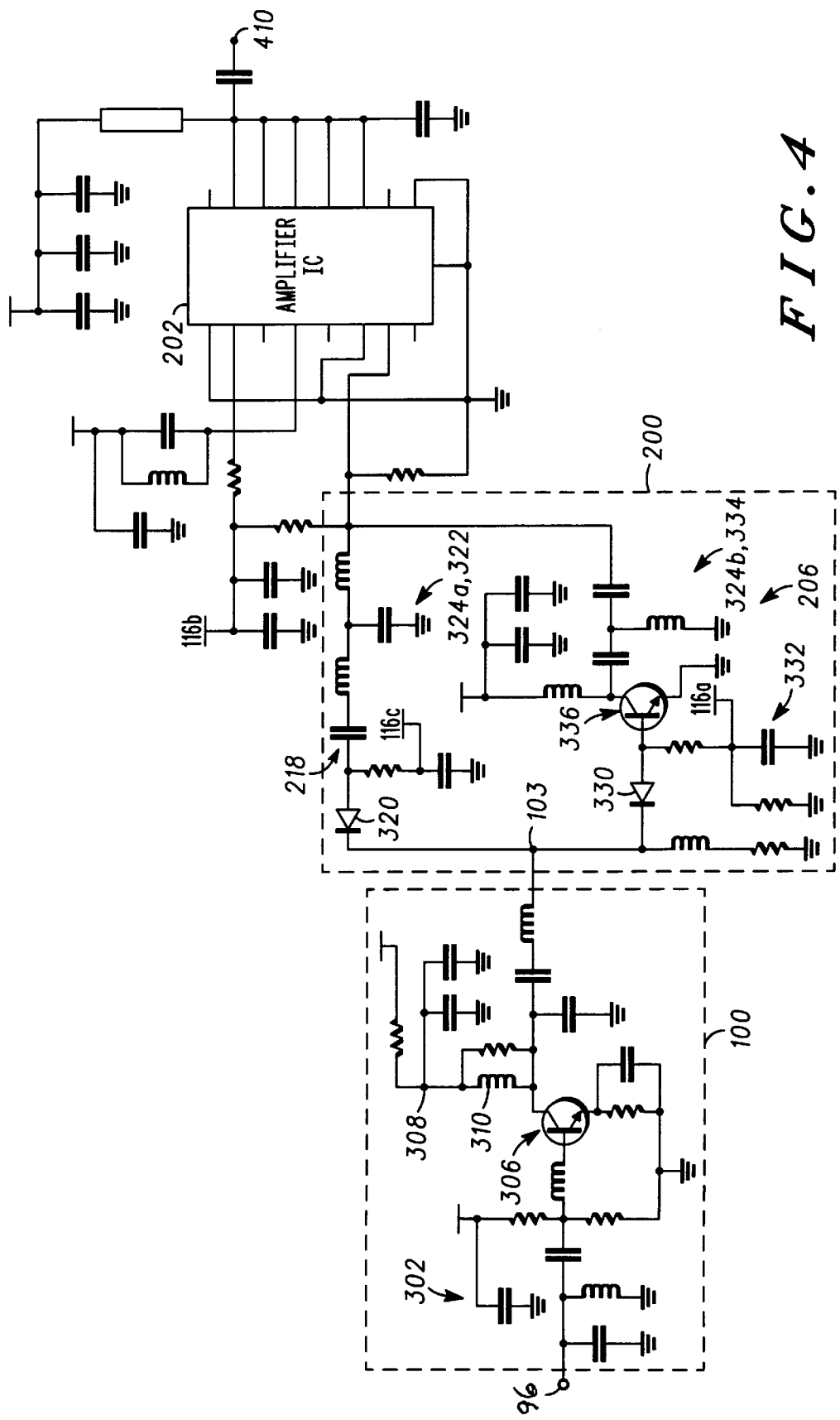
FIGS. 4–6 is a circuit schematic illustrating the multiple band amplifier and a portion of the processor in still greater detail with the addition of an output filter and power control.
Figure 5:
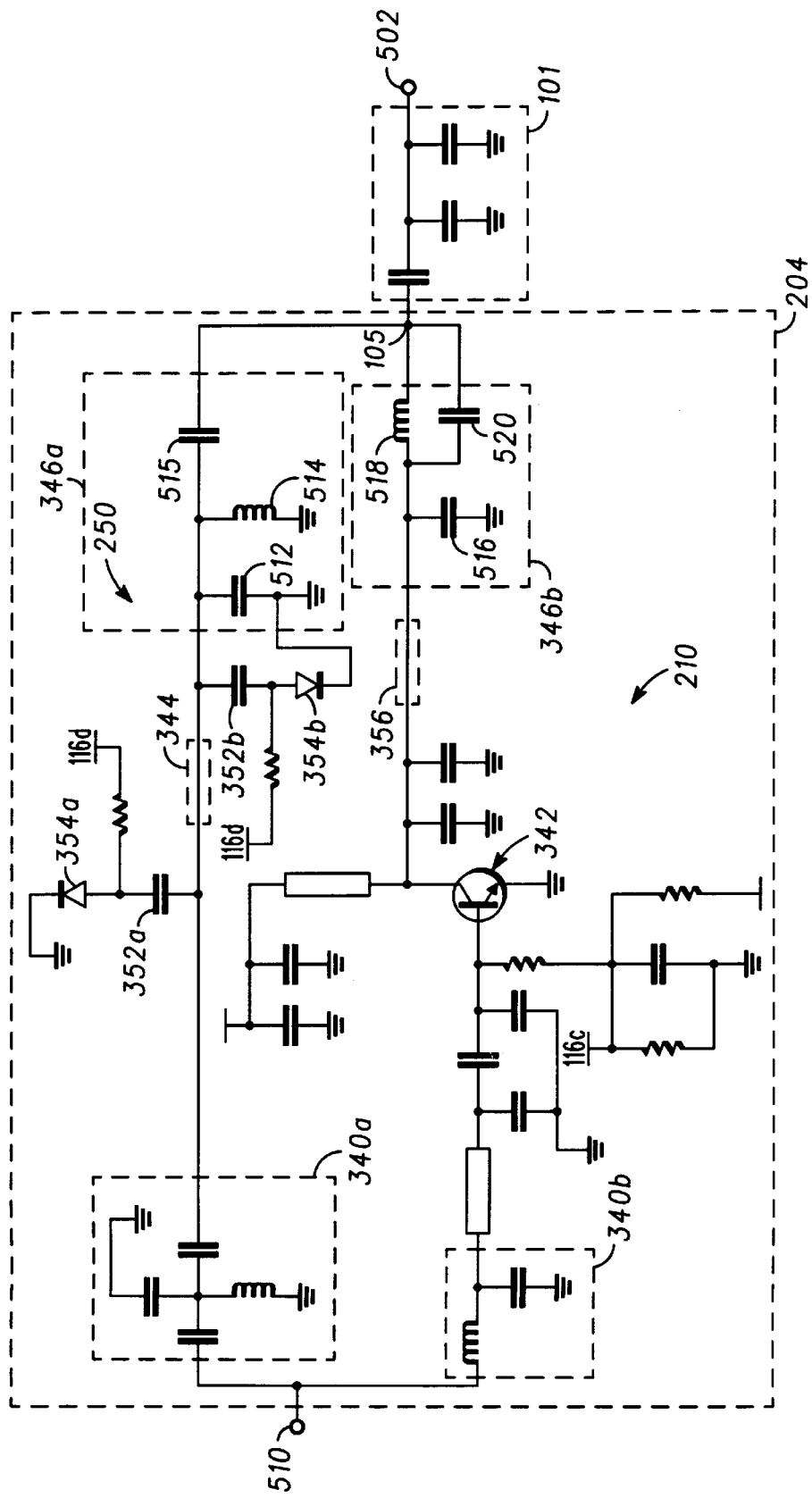
Figure 6:
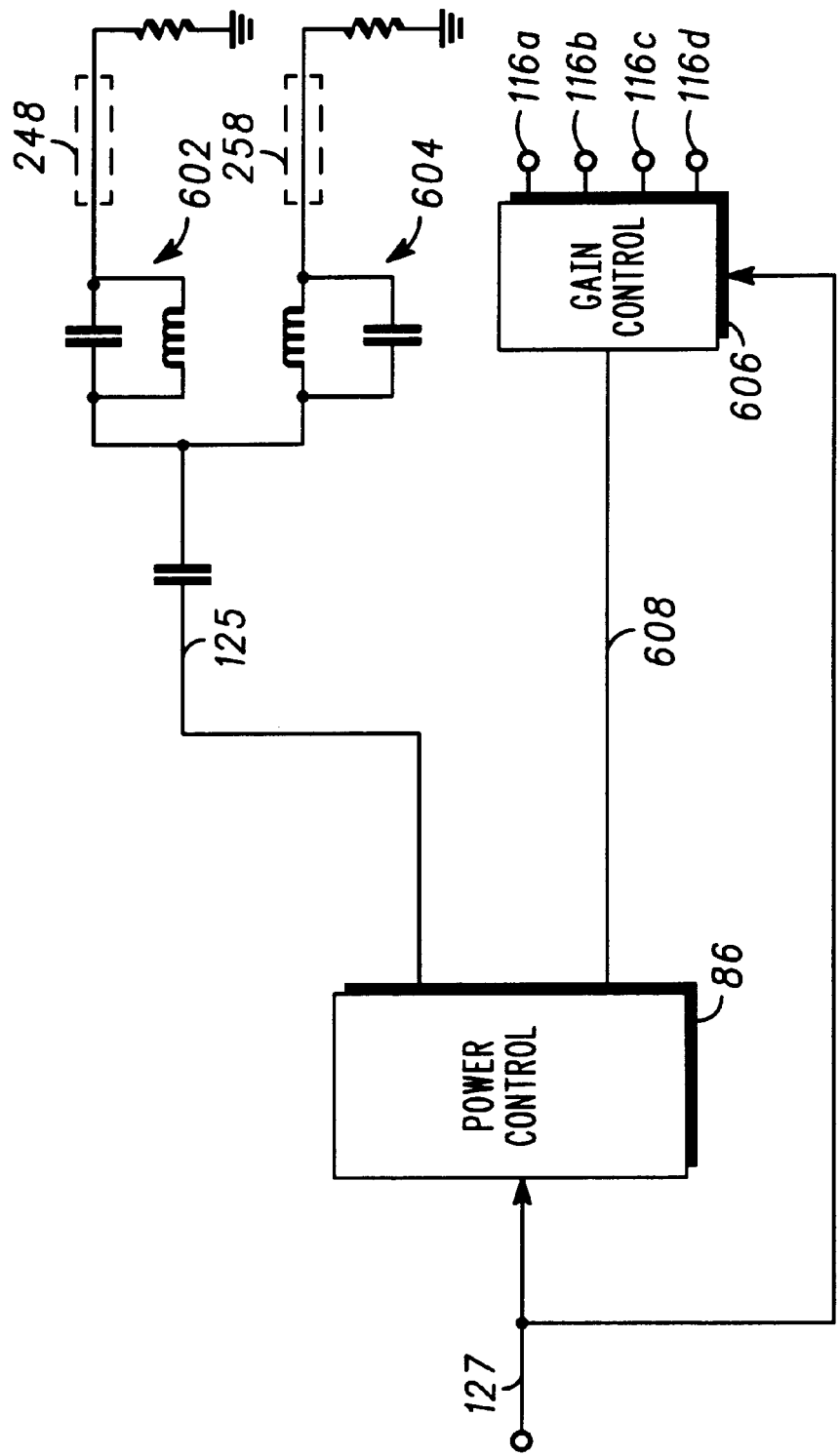

With reference now to FIGS. 4, 5 and 6, the amplifier 104 will now be described in greater detail. For brevity, each of the elements shown in the figure will not be described in detail. However, the components functionality will be described.

The buffer 100 (FIG. 4) is connected between mixer 80 and amplifier 200. The buffer provides gain and reverse isolation.

The amplifier input 103 is connected to receive the output of buffer 100. The first amplifier stage 200 bypass 218 includes matching network 322. Matching network 322 passes signals in the lower frequency band and provides impedance transformation to optimize performance of second amplifier stage 202 for signals in the lower frequency band. When signals in the lower frequency band are present at input 103, signal 116c is "ON", such that the diode 320 is forward biased and input signals will pass through diode switch 320, matching network 322, and the low frequency side 324a of diplexer 324, to second amplifier stage 202. The diode switch 330 is open, the transistor amplifier 336 is biased "OFF", and the high frequency side 324b rejects the lower frequency band signals, providing high level of isolation, when signal 116c is at its "OFF" level, indicating that higher band signals are present.

The first amplifier stage 200 includes matching network 332 for passing signals in an upper frequency band. Matching network 332 passes signals in the upper frequency band and provides impedance transformation to provide optimum performance from amplifier 336 and second amplifier stage 202 for signals in the upper frequency band. When signals in the upper frequency band are present at input 103, the diode switch 330 is forward biased ("ON") by signal 116a and amplifier 336 is biased by 116a. Signals in the upper frequency band will pass through diode switch 330, matching network 322, amplifier 336 (amplified as controlled by gain control signal 116a), and side 324b of diplexer 324 to second amplifier stage 202. The gain of amplifier 336 is controlled by signal 116a.

When lower frequency band signals are present, the diode switch 320 is biased open by the signal 116a being "OFF". The "OFF" signal also biases amplifier 336 "OFF". Filter 324b presents a very high impedance to low frequency signals relative to filter 324a. For example, filter 324a can be a lowpass filter and filter 324b can be a highpass filter. The two paths through the first amplifier stage are thus isolated, preventing feedback and leakage though the unused path. This provides a more stable and efficient amplifier than can be provided without isolation.

The second amplifier stage 202 amplifies the signals output from the first amplifier stage. The amplifier gain is set by a gain control signal 116b. The second amplifier stage 202 may be implemented using commercially available dual gallium arsenide field effect transistors (FET) tuned to operate at the high and low frequency bands, but having an optimum efficiency and output power in the upper frequency band.

The second amplifier stage 202 generates an output signal at output 410. Output 410 is connected to terminal 510 (FIG. 5). Terminal 510 is the input to the third amplifier stage 204. The third amplifier stage includes diplexer filters 340a, capacitors 352a, 352b connected to ground through diode switches 354a, 354b, and diplexer filter 346a, to pass the higher frequency band signals. Filters 340b and 346b present high isolation to signals in the upper frequency band, relative to filters 340a and 346a, to prevent feedback through the alternate signal paths in the third amplifier stage.

The third amplifier stage includes diplexer filters 340b (FIG. 5), amplifier 342 (having a gain controlled by the control signal on 116c), and diplexer filter 346b to pass lower frequency signals. Although bipolar transistors are illustrated, it will be recognized that the transistor amplifiers can be implemented using MOSFET elements. Filters 340a and 346a present a very high impedance to signals in the lower frequency band relative to the impedance presented by filters 340a and 346a to such signals. The third amplifier stage 204 also includes sensing elements 344 and 356, which can be implemented using coupled transmission lines.

The third, or output, amplifier stage includes harmonic rejection filters through bypass 250. The bypass 250 includes diodes 354a and 354b, and capacitors 352a and 352b. When the lower frequency band is selected, signal 116c and 116d are "ON". Diode 354a and 354b are forward biased. The lead inductance of diode 354a and 354b resonate with capacitors 352a and 352b at the second harmonic of the lower frequency band. This provides harmonic rejection though the bypass 250. The potential on 116c sets the gain of the amplifier 210.

The diplexer 346 can be broken into two arms. The higher frequency band arm 346a and the lower frequency band arm 346b. The higher frequency band arm 346a consists of elements 512, 514, and 515. The lower frequency band arm 346b consists of elements 518, 520 and 516. Harmonic rejection of the second harmonic of the higher frequency band is provided by the selection of element 512. Element 512 may be chosen to have a self resonance (due to capacitor lead inductance) at the second harmonic of the higher frequency band. Thus the higher frequency arm of 346a provides isolation for the lower frequency band as well as the 2nd harmonic of the higher frequency band signals.

Elements 512 and 518 of the lower frequency arm 346b may be chosen to resonate at the second or third harmonic of the lower frequency band. This will provide second and third harmonic rejection through the lower frequency band arm 346b. In addition, element 516 may be chosen to have a self resonance (due to capacitor lead inductance) in the 2nd or 3rd harmonic of the lower frequency band. This will add harmonic rejection of the lower frequency band of signals flowing through the lower frequency arm 346b.

When high frequency signals are present, bias 116c and 116d are "OFF", thus turning "OFF" transistor amplifier 342. High frequency signals flow through 340a of diplexer 340 and high side 346a of diplexer 346 in bypass 250.

The amplifier 105 output is filtered by filter 101.

With reference to FIG. 6, the power control circuit is shown in greater detail. The power control 86 is responsive to power setting signals on bus 127 to set the gain of amplifier 104. The power control 86 compares the control signal level on bus 127 to a feedback signal on conductor 125, which is detected by sensor elements 348 and 358. The signals from sensor elements 348 and 358 are passed through a diplexer comprising filters 602 and 604. The filter 602 passes signals in the lower frequency band and the filter 604 passes signals in the upper frequency band. In either case, the signal from only one of the sensors will be passed as only one of the passbands is active at any given time. The power control circuit adjusts the signal on conductor 608 up and down depending upon the result of the comparison.

If the sensed signal is lower that the control signal on bus 127, the signal on conductor 608 is increased. If the sensed signal is above the input control signal, the control signal on conductor 608 is lowered. The gain control 606 distributes the gain to amplifier stages by generating gain control signals on bus 116 by providing different gain control signals to each of the amplifier stages 200, 202, and 204 through outputs 116a, 116b and 116c. Power control 86 is controlled by processor 108 to generate an "OFF" signal on conductor 116a when lower band signals are to be transmitted. Power control 86 is controlled by processor 108 to generate an "OFF" signal on conductor 116c when higher band signals are to be transmitted. Bias signals on conductors 116a and 116b are used to set the gain of amplifier 104 when higher band signals are to be transmitted. Bias signals on conductors 116c and 116b are used to set the gain of amplifier 104 when lower band signals are to be transmitted.

Thus it can be seen that an efficient, dual band amplifier is disclosed. The circuit is more efficient and less expensive than circuitry providing two distinct paths or using switched matching networks.

We claim:

1. An amplifier for a dual band device, comprising:
    an input;
    an output;
    multiple amplifier stages coupled between said input and output, said multiple amplifier stages including a first amplifier stage having a first amplifier optimized for operation in a first frequency band, a second amplifier stage having a second amplifier optimized for operation in the first frequency band, and a third amplifier stage having a third amplifier optimized for operation in a second frequency band different from the first frequency band, one of said first and second frequency bands being higher than the other one of said first and second frequency bands;
    a first bypass associated with said first amplifier stage, said first bypass to provide for signals in the second frequency band a signal path that bypasses said first amplifier; and
    a second bypass associated with said third amplifier stage, said second bypass to provide for signals in the first frequency band a signal path that bypasses said third amplifier,
    wherein said second amplifier amplifies signals in said first and second frequency bands to provide an output amplifier for operation in the first frequency band and an exciter amplifier coupled to the second amplifier for operation in the second frequency band.

2. An amplifier for a dual band device, comprising:
    an input;
    an output;
    multiple amplifier stages coupled between said input and output, said multiple amplifier stages including a first amplifier stage having a first amplifier, a second amplifier stage having a second amplifier, and a third amplifier stage having a third amplifier;
    a first bypass in said first amplifier stage, said first bypass to provide for signals in a first frequency band a signal path that bypasses said first amplifier;
    a second bypass in said third amplifier stage, said second bypass to provide for signals in a second frequency band a signal path that bypasses the third amplifier;
    wherein signals in said first and second frequency bands are amplified by said second amplifier; and
    wherein said first amplifier stage includes a diplexer coupled to said first amplifier and said first bypass to isolate said first bypass and said first amplifier to prevent feedback through said first bypass.

3. The amplifier as defined in claim 2, wherein said first amplifier stage further comprises a first diode switch coupled between said input and said first bypass and a second diode switch coupled between said input and said first amplifier, said first and second diode switches selectively turned on and off by mode control signals.

4. The amplifier for a dual band device as defined in claim 2, wherein said third amplifier stage includes a diplexer coupled to said third amplifier and said second bypass to isolate said second bypass and said second amplifier to prevent feedback through said second bypass.

5. An amplifier for a dual band device, comprising:
    an input;
    an output;
    multiple amplifier stages coupled between said input and output, said multiple amplifier stages including a first amplifier stage having a first amplifier, a second amplifier stage having a second amplifier, and a third amplifier stage having a third amplifier;
    a first bypass in said first amplifier stage, said first bypass to provide for signals in a first frequency band a signal path that bypasses said first amplifier;
    a second bypass in said third amplifier stage, said second bypass to provide for signals in a second frequency band a signal path that bypasses the third amplifier;
    wherein signals in said first and second frequency bands are amplified by said second amplifier; and
    wherein said third amplifier stage includes a first sensor coupled to detect a signal level in said first frequency band and a second sensor coupled to detect a signal level in said second frequency band.

6. The amplifier for a dual band device as defined in claim 1, further including a bias control input for said first and second amplifier stages, said bias control input selecting operation in said first and second frequency bands.

7. The amplifier for a dual band device as defined in claim 1, further including bias control signals for said amplifier stages, said bias control signals controlling a gain and signal path for operation in the first and second frequency bands.

8. A dual band communication device, comprising:
    a signal source;
    a modulator coupled to said signal source, said modulator having a control signal input;
    a control circuit coupled to said control signal input, said control circuit controlling said modulator to output signals in either one of a first frequency band and a second frequency band, wherein one of said first and second frequency bands is higher than the other one of said first and second frequency bands; and multiple amplifier stages, said multiple amplifier stages including a first amplifier stage having a first amplifier optimized for operation in the first frequency band, a second amplifier stage having a second amplifier optimized for operation in the first frequency band, and a third amplifier stage having a third amplifier optimized for operation in the second frequency band;

a first bypass coupled to said control circuit and associated with said first amplifier stage, said first bypass to provide for signals in the second frequency band a signal path that bypasses said first amplifier;

a second bypass coupled to said control circuit and associated with said third amplifier stage, said second bypass to provide for signals in the first frequency band a signal path that bypasses said third amplifier; and wherein said second amplifier amplifies signals in said first and second frequency bands to provide an output amplifier for operation in the first frequency band and an exciter amplifier coupled to the second amplifier for operation in the second frequency band.

9. The communication device as defined in claim 8, further comprising:

a first bypass to provide a signal path for signals in a first frequency band to bypass a first amplifier in one of said amplifier stages; and a second bypass to provide a signal path for signals in a second frequency band to bypass a second amplifier in an other one of said amplifier stages.

10. The communication device as defined in claim 9, wherein said first amplifier is optimized for operation in said second frequency band and said first bypass is to bypass said first amplifier.

11. The communication device as defined in claim 10, wherein said second amplifier is optimized for operation in said first frequency band and said second bypass is to bypass said second amplifier.

12. The communication device as defined in claim 11, wherein one of said amplifier stages includes a third amplifier to amplify signals in said first and second frequency bands, said third amplifier optimized for said second frequency band and tuned for both said first and second frequency bands.

13. A dual band communication device, comprising:

a signal source;

a modulator coupled to said signal source, said modulator having a control signal input;

a control circuit coupled to said control signal input, said control circuit controlling said modulator to output signals in either one of a first frequency band and a second frequency band, wherein said first and second frequency bands comprise significantly different frequencies;

an amplifier coupled to said modulator, said amplifier to amplify signals output from said modulator in said first frequency band and said second frequency band for further transmission, said amplifier including a plurality of stages, a first amplifier stage to amplify only signals in the first frequency band, a second amplifier stage to amplify signals in both said first and second frequency bands, and a third amplifier stage to amplify signals only in the second frequency band;

a first bypass to provide a signal path for signals in a first frequency band to bypass a first amplifier in one of said amplifier stages;

a second bypass to provide a signal path for signals in a second frequency band to bypass a second amplifier in an other one of said amplifier stages, said first amplifier optimized for operation in said second frequency band and said first bypass is to bypass said first amplifier, and said second amplifier optimized for operation in said first frequency band and said second bypass is to bypass said second amplifier; wherein one of said amplifier stages includes a third amplifier to amplify signals in said first and second frequency bands, said third amplifier optimized for said second frequency band and tuned for both said first and second frequency bands; and a diplexer coupled to said first amplifier and said first bypass to isolate said first bypass and said first amplifier to prevent feedback.

14. The communication device as defined in claim 13, further including a diplexer coupled to said second and said second bypass to isolate said second bypass and said second amplifier to prevent feedback through said second amplifier.

15. The communication device as defined in claim 14, wherein said first amplifier stage further comprises diode switches coupled between an input, said first bypass and said first amplifier, said diode switches turned on and off by a band control signal.

16. The amplifier for a dual band device as defined in claim 1, wherein said first amplifier stage includes a diplexer coupled to said first amplifier and said first bypass to isolate said first bypass and said first amplifier to prevent feedback through said first bypass.

17. The amplifier for a dual band device as defined in claim 1, wherein said first amplifier stage further comprises a first diode switch coupled between said input and said first bypass and a second diode switch coupled between said input and said first amplifier, said first and second diode switches selectively turned on and off by mode control signals.

18. The amplifier for a dual band device as defined in claim 1, wherein said third amplifier stage includes a diplexer coupled to said third amplifier and said second bypass to isolate said second bypass and said third amplifier to prevent feedback through said second bypass.

* * * * *